(12) United States Patent
Montenegro et al.

(10) Patent No.: US 9,329,223 B2
(45) Date of Patent: May 3, 2016

(54) DEEP LEVEL TRANSIENT SPECTROMETER

(75) Inventors: Daniel E. Montenegro, Scotia, NY (US); Jason B. Rothenberger, Colonie, NY (US); Mark A. Prelas, Columbia, MO (US); Robert V Tompson, Jr., Columbia, MO (US); Annie Tipton, San Antonio, TX (US)

(73) Assignee: The Curators of the University of Missouri, Columbia, MO (US)

( * ) Notice: Subject to any disclaimer, the term of this patent is extended or adjusted under 35 U.S.C. 154(b) by 940 days.

(21) Appl. No.: 13/540,151

(22) Filed: Jul. 2, 2012

(65) Prior Publication Data
US 2013/0054177 A1     Feb. 28, 2013

Related U.S. Application Data

(60) Provisional application No. 61/571,605, filed on Jun. 30, 2011.

(51) Int. Cl.
*G01R 31/00* (2006.01)
*G01R 31/26* (2014.01)

(52) U.S. Cl.
CPC .................................. *G01R 31/2648* (2013.01)

(58) Field of Classification Search
CPC ... G01R 31/2648; G01R 31/26; G01R 31/312
See application file for complete search history.

(56) References Cited

U.S. PATENT DOCUMENTS

| | | | |
|---|---|---|---|
| 3,859,595 A | | 1/1975 | Lang |
| 5,521,839 A | | 5/1996 | Doolittle et al. |
| 6,011,404 A | * | 1/2000 | Ma .................... G01R 31/265 257/E21.531 |

OTHER PUBLICATIONS

B. M. Arora, S. Chakravarty, S. Subramanian, V. I. Polyakov, M. G. Ermakov, O. N. Ermakova and P. I. Perov, Deep-level transient charge spectroscopy of Sn donors in AlxGa1-xAs, Journal of Applied Physics 73, pp. 1802-1807 (1993).

D. V. Lang, Deep-level transient spectroscopy: A new method to characterize traps in semiconductors, Journal of Applied Physics 45, pp. 3023-3032 (1974).

J. W. Farmer, C. D. Lamp and J. M. Meese, Charge transient spectroscopy, Applied Physics Letters 41, 1063-1065 (1982).

V. I. Polyakov, N. M. Rossukanyi, A. I. Rukovishnikov, S. M. Pimenov, A. V. Karabutov and V. I. Konov, Effects of post-growth treatment and coating eith ultathin metal layers on the band bending and field electron emission of diamond films, Journal of Applied Physics 84, pp. 2882-2889 (1998).

\* cited by examiner

*Primary Examiner* — Mischita Henson
(74) *Attorney, Agent, or Firm* — Polster Lieder

(57) ABSTRACT

A method for detecting surface and bulk deep states in semiconductor materials is provided. In various embodiments, the method comprises configuring a detection circuit of charge based deep level transient spectrometer in one of a parallel mode and a series mode by controlling the configuration of a switching circuit of the detection circuit. The method additionally comprises generating digitized voltage charge outputs of a device under test utilizing the detection circuit as controlled via execution of an analog-to-digital conversion and timing program by a control system of the charge based deep level transient spectrometer. Furthermore, the method comprises obtaining desired information about deep level transients of the device under test based on the digitized voltage charge outputs via execution of a control system operable to execute a Q-DLTS data analysis program by the control system.

9 Claims, 8 Drawing Sheets

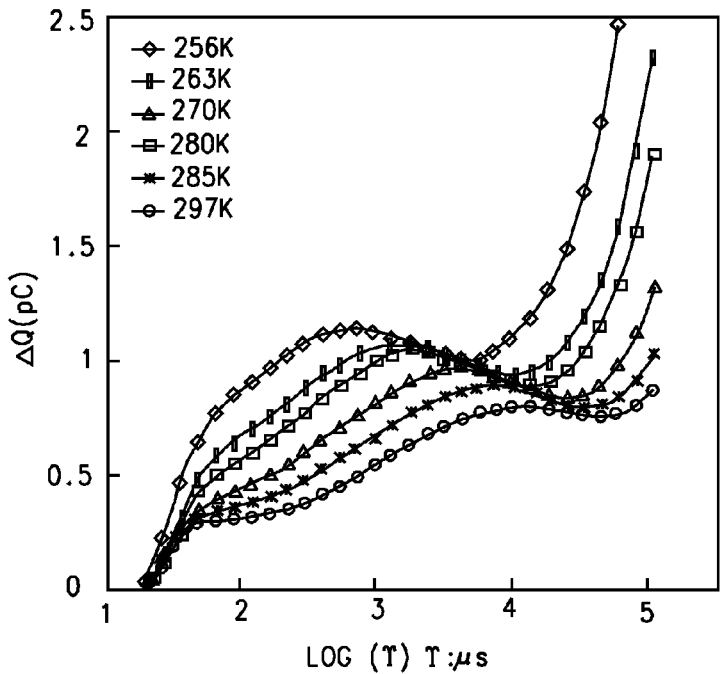
F I G. 10
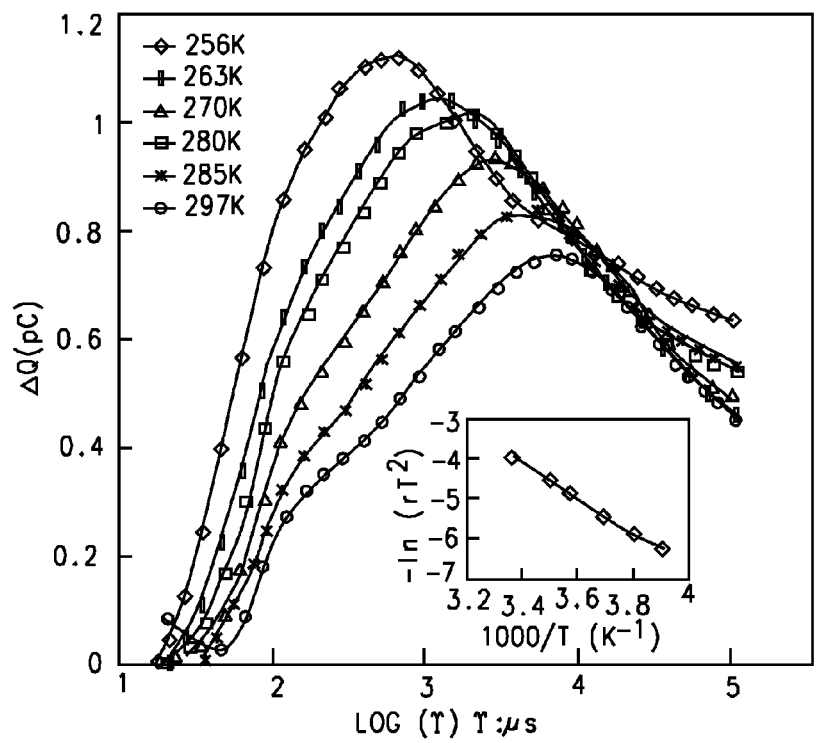
F I G. 11

DEEP LEVEL TRANSIENT SPECTROMETER

CROSS-REFERENCE TO RELATED APPLICATIONS

This application claims the benefit of U.S. Provisional Application No. 61/571,605, filed on Jun. 30, 2011. The disclosure of the above application is incorporated herein by reference in its entirety.

GOVERNMENT RIGHTS

This invention was made with Government support under Grant No. NRC-38-08-959 awarded by the Nuclear Regulatory Commission, Grant No. DE-FG07-071D14892 awarded by the Department of Education, and Grant No. W911 SR-07-C-0004 awarded by the Defense Threat Reduction Agency. The Government has certain rights in the invention.

FIELD

The present disclosure relates to a deep level transient spectrometer, more specifically, to a charge-based deep level transient spectrometer that is a combination of a relatively simplified circuit structure and software-based signal processing algorithms to achieve quantitative spectrum analysis.

BACKGROUND

The statements in this section merely provide background information related to the present disclosure and may not constitute prior art.

One of the most widely utilized methods for characterization of the deep-level centers in semiconductors is deep-level transient spectroscopy or DLTS, first proposed by D. V. Lang. This technique is based on the measurement of junction capacitance transients due to thermal emission during a return to equilibrium conditions. However, conventional DLTS suffers from inherent setbacks. For example, if the series resistance of the device under test (DUT) is large, the capacitance transient may vary with the measurement frequency. If the resistivity is large enough, the capacitance transient might approximate the geometric capacitance for all measurement frequencies. For heavily doped materials, capacitance spectroscopy suffers from poor sensitivity. Furthermore, systems using a capacitance bridge for measurement are inherently slow. Improvements have been made in the U.S. Pat. No. 5,521,839 to Doolittle, et al., which described a DLTS system that employs a pseudo-logarithmic data storage scheme to digitize and analyze capacitance transients acquired from a test material.

Alternative measurement schemes have been proposed over the years. These methods rely on the direct measurement of thermally stimulated current transients, or the integration of these currents to yield charge transients. These systems rely on hardware based timing mechanisms to perform the required DLTS signal processing.

SUMMARY

Generally, the present disclosure provides a software-based Charge Deep Level Transient Spectrometer (Q-DLTS) system for the characterization of semiconductor materials. The design innovation lies in the exclusion of all hardware-based data processing in favor of upgradable software-based algorithms. In various embodiments, various essential electronic components are those needed to amplify and integrate the thermally emitted trapped charge transients, and to provide the timing signals that control each measurement cycle. The data acquisition device then samples the amplified charge output at a user-defined and constant sampling rate, and then transfers the digitized data to memory of the control system. The described software algorithm then digitally compensates for spurious input signals and filters the raw data to produce a Q-DLTS spectrum based upon user-defined input parameters.

In various embodiments, a method for detecting surface and bulk deep states in semiconductor materials is provided. The method comprises configuring a detection circuit of charge based deep level transient spectrometer in one of a parallel mode and a series mode by controlling the configuration of a switching circuit of the detection circuit. The method additionally comprises generating digitized voltage charge outputs of a device under test utilizing the detection circuit as controlled via execution of an analog-to-digital conversion and timing program by a control system of the charge based deep level transient spectrometer. Furthermore, the method comprises obtaining desired information about deep level transients of the device under test based on the digitized voltage charge outputs via execution of a control system operable to execute a Q-DLTS data analysis program by the control system.

Further areas of applicability of the present teachings will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

FIG. 10 is a graphical illustration of an uncompensated spectrum showing typical artifacts caused by leakage currents and parasitic capacitance resulting from use the Q-DLTS system shown in FIG. 1, in accordance with various embodiments of the present disclosure.

FIG. 11 is a graphical illustration of a compensated Q-DLTS spectra obtained from the as-received sample resulting from use the Q-DLTS system shown in FIG. 1, in accordance with various embodiments of the present disclosure.

Corresponding reference numerals indicate corresponding parts throughout the several views of drawings.

DETAILED DESCRIPTION

Figure 1:
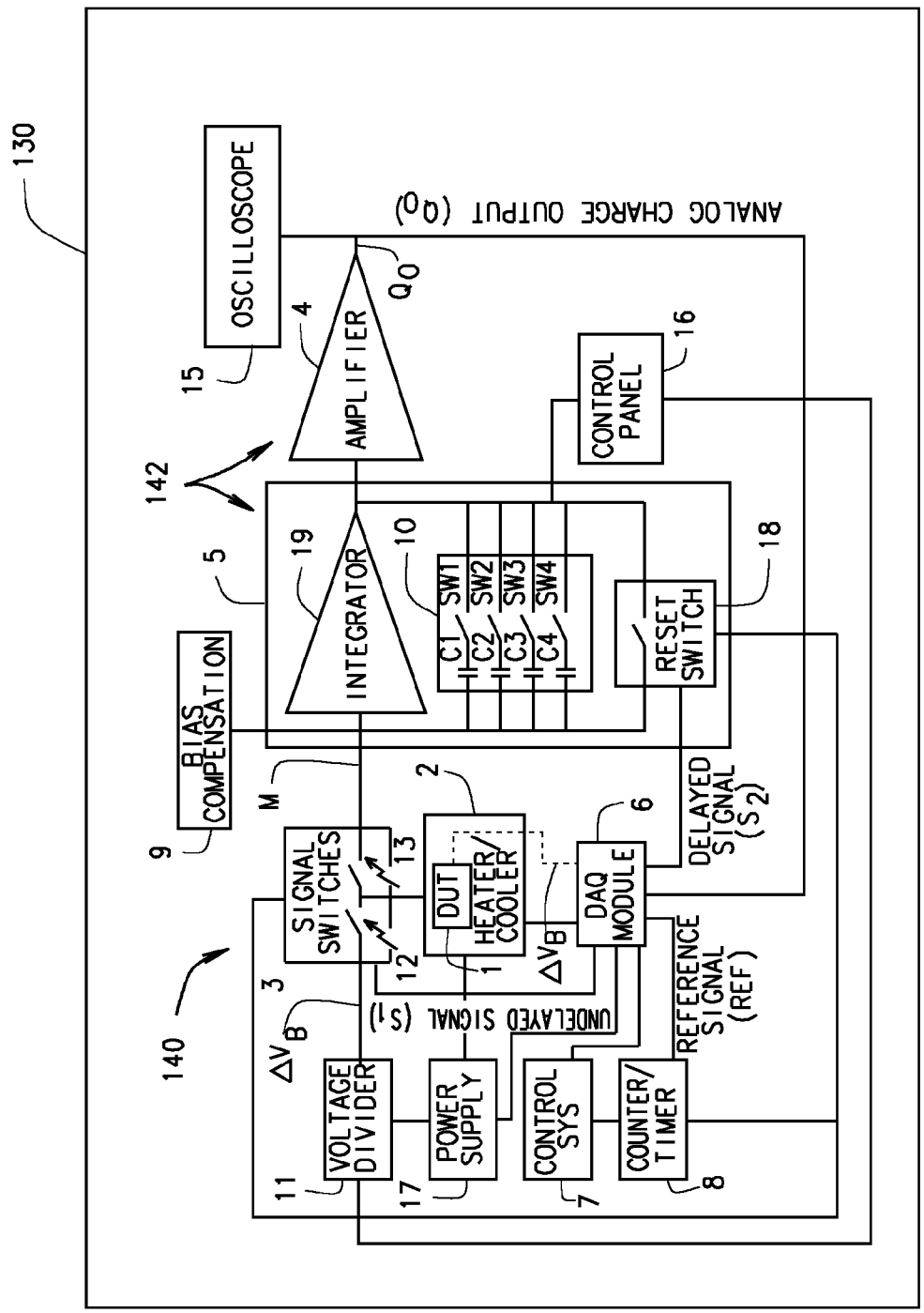
FIG. 1 is an exemplary schematic diagram of a charge based deep-level transient spectroscopy (Q-DLTS) system, in accordance with various embodiments of the present disclosure.

The following description is merely exemplary in nature and is in no way intended to limit the present teachings, application, or uses. Throughout this specification, like reference numerals will be used to refer to like elements.

Unless otherwise defined, all technical and scientific terms used herein have the same meaning as commonly understood by one of ordinary skill in the art. All publications, patent applications, patents, and other references mentioned herein are incorporated by reference in their entirety.

The present disclosure provides a charge based deep level transient spectrometer (Q-DLTS) 130 provides software capabilities, high sensitivity and simplicity of construction. In various embodiments, the Q-DLTS 130 comprising a detection circuit 140, a temperature control chamber 2, an oscilloscope 15 and a computer based control system 7 that executes one or more software based signal sampling, timing and analysis algorithm(s), program(s) or software to characterize the surface and bulk deep states in semiconductor materials. The temperature control chamber 2 is a dedicated chamber structured and operable to house the DUT 1 separately from the other components of the detection circuit 140 and to maintain the DUT 1 at a specified temperature and protect/shield the DUT 1 from other environmental interference such as electromagnetic interference.

Generally, the detection circuit 140 comprises a switching circuit 3, an amplifier circuit 142 that includes an integration circuit 5 and a secondary amplifier 4, one or more, e.g., three, counters/timers 8, a bias compensation module 9, a voltage divider 11, a control panel 16 and a power supply 17. The control system 7 is in communicatively connected with the data acquisition module 6 and includes at least one processor (not shown) and at least one electronic memory device (not shown). Moreover, the control system 7 is structured and operable to execute the signal sampling, timing and analysis algorithm(s), and other algorithms or programs described herein, to control and data detection, acquisition, integration and analysis processes of the detection circuit 140 for analyzing digitized charge transients in a device under test (DUT) 1, as described below. Additionally, the data acquisition module 6, as controlled by the control system 7, is structured and operable to digitize the charge transients and control various operations of the detection circuit 140.

Generally, the Q-DLTS 130 provides novel and non-obvious improvements over existing DLTS and Q-DLTS systems that are based on various methods such as techniques that rely on cyclic bias pulses to momentarily excite the traps of p-n junctions and Schottky barriers. In such techniques, the electron occupation of a level is monitored as it returns to thermal equilibrium by measuring the associated charge transients. In this scheme, a "rate window" is defined as a function of two measuring gate times ($t_1$ and $t_2$) starting at the beginning of the trap discharge. The charge transient is measured at these two times and the difference, $Q(t_2)-Q(t_1)$, is plotted as a function of temperature. According to Maxwell-Boltzmann statistics, the thermal emission rates are strongly dependent upon temperature. At a particular temperature, a thermal scan will produce an emission rate that matches the rate window.

Therefore, a peak in the spectrum is produced because $Q(t_2)-Q(t_1)$ is maximized. If several emission rates are present, then multiple peaks appear.

If the time (t) dependent trap distribution is assumed to be uniform then the current can be described as $$i(t) = \frac{AqWN_T \exp\left(\frac{-t}{\tau_T}\right)}{2\tau_T} \quad (1)$$

where A is the junction area, q is the elementary charge, W is the junction depletion width, $N_T$ is the trap density, and $\tau_T$ is the decay time constant. To obtain the charge emitted, the previous equation must be integrated over time, $$Q(t) = \int_0^t i(t)\,dt = \frac{AqWN_T}{2\tau_T}\int_0^t \exp\left(-\frac{t}{\tau_T}\right)dt = \frac{AqWN_T}{2}\left(1-\exp\left(-\frac{t}{\tau_T}\right)\right) \quad (2)$$

The prefactor in Eq. (2) is the total charge collected, $$Q_0 = \int_0^\infty i(t)\,dt = \frac{AqWN_T}{2} \quad (3)$$

Traditionally in typical DLTS, the rate window or $\tau^{-1}$ is kept constant while the temperature is varied. A similar method is to maintain a constant temperature while the rate window is varied. This rate window can be described as a function of the ratio of the gate times (i.e., $t_2/t_1=\alpha$) as $$\tau^{-1} = \frac{\ln(t_2/t_1)}{t_2-t_1} = \frac{\ln\alpha}{(\alpha-1)t_1} \quad (4)$$

Similar to Lang's algorithm, the gate timed charge difference emitted from the beginning of discharge is simply, $$\Delta Q = Q(t_1) - Q(t_2) \quad (5)$$

For electrons, the previous equation can be also written as, $$\Delta Q = Q_0(\exp(-e_n t_1) - \exp(-e_n t_2)) \quad (6)$$

where $e_n$ is the electron emission rate, which has the form $$e_n = \sigma \Gamma_n T^2 \exp\left(-\frac{E_a}{kT}\right) \quad (7)$$

where $\sigma$ is the capture cross-section, T is the temperature, $E_a$ is the activation energy, k is the Boltzmann constant, and $\Gamma_n$ is defined as, $$\Gamma_n = 2\sqrt{3}\,(2\pi/h^2)^{3/2} k^2 m_n \quad (8)$$

in which h is Planck's constant and $m_n$ is the effective mass of the electron. The equations for holes are analogous. For a given temperature, a maximum in the spectrum will occur when the rate window equals the emission rate of the trap. This can be easily verified by differentiating Eq. (6), which yields, $$e_n = \frac{\ln \alpha}{(\alpha - 1)t_1} \quad (9)$$

Substituting for $\alpha=2$ into Eq. (9) (which corresponds to the present embodiment) we have, $$e_n = \ln 2 / t_1 \quad (10)$$

Substituting this value back into Eq. (6) we obtain, $$\Delta Q_{max} = Q_0 / 4 \quad (11)$$

Eq. (11) is significant because it allows a direct calculation of the total charge collected from the Q-DLTS peak maxima. Finally, because of the Arrhenius dependence of the emission rate, the values of $\sigma$ and $E_a$ can be calculated using Eq. (7). Although not described herein, further averaging algorithms such as $n^{th}$ Order Filtering, Fourier-based Multi-Exponential DLTS and the Gardner transform are possible, and even desired.

Referring further to FIG. 1, in various implementations, the DUT 1 can be a sensor or a semiconductor that is placed in the temperature control chamber 2. As described above, the switching circuit 3, the amplifier 4, and the integration circuit 5 are controlled and/or regulated by the cooperative operation of the control system 7 and the data acquisition module 6, and the detection circuit 140 includes one or more, e.g., multiple, counter/timers 8. Accurate control of the switching timing of the switches 12 and 13 in the switching circuit 3 and of the reset switch 18 is essential to minimize the sampling of spurious signals, and the loss of relevant data. In various embodiments, dual-gated signal averaging and/or other data processing schemes, and the compensation for non-ideal circuit behavior are performed post-sampling by the signal sampling, timing and analysis algorithm(s). Additionally, high signal-to-noise ratios (SNRs) can be obtained by multiple averaging and low-pass filtering of the digitized data output from the secondary amplifier 4. This does not translate into longer processing times because the time spent by traditional DLTS hardware circuits in repetitive measurement cycles of increasing length is entirely avoided. Instead, the signal sampling, timing and analysis algorithm(s) speedily obtain(s) the desired emission spectrum.

In various implementations, the integration circuit 5 includes a low-noise integration amplifier 19 with fast switching capabilities, e.g., an LMC6001 ultra-low current amplifier from National Semiconductor, a capacitor/switching block 10 and a reset switch 18. Generally, the integration circuit 5 integrates a charge output of the DUT 1 over time, thereby converting the charge output to a voltage charge output which is amplified via the integration amplifier 19 and then further amplified by the secondary amplifier 4.

Figure 9:
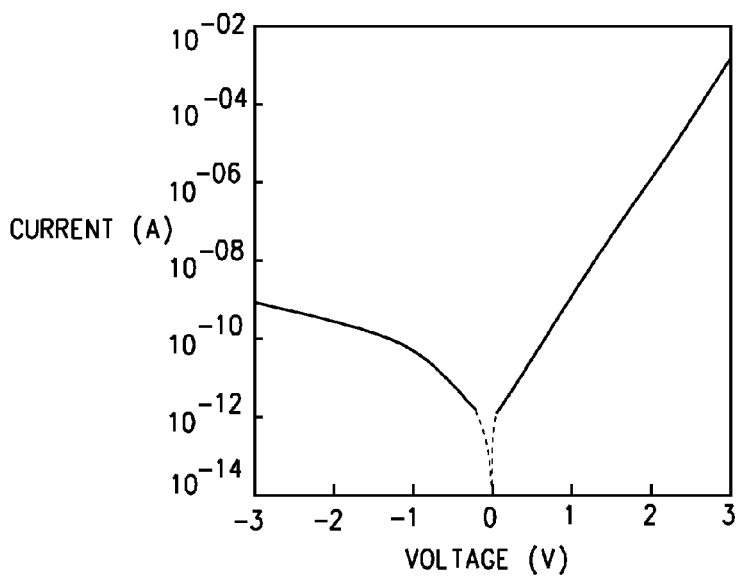
FIG. 9 is a graphical illustration of I-V characteristics in a semi-logarithmic scale of an as-received commercial GaN/SiC blue LED structure showing a typical diode behavior resulting from use the Q-DLTS system shown in FIG. 1, in accordance with various embodiments of the present disclosure.

Additionally, the leakage current from DUT 1 and the input bias current of the integrator 19 can be compensated for in, or filtered out of, the pre-amplified input signal M to the integration circuit 5, i.e., the charge output signal from DUT 1, with a bias compensation module 9, e.g., a simple voltage divider. Particularly, for proper circuit behavior, leakage currents from the DUT 1 must be controlled, especially at low input currents. Additionally, shield and guard rings can be utilized to reduce leakage current from the DUT 1, however, it is better to have none of the terminals associated with the pre-amplified input signal M in contact with the printed circuit board (PCB) of the detection circuit 140. For example, using air wiring and enclosing all components of the detection circuit 140 except the DUT 1 and the temperature control chamber 2 in a shielded enclosure minimizes leakage, electrostatic interference and airborne ions impinging on the integrating capacitors 10. If care is taken with the hardware components and correction algorithms are employed to overcome non-ideal circuit behavior (e.g., charge injection, parasitic capacitive coupling, electronic noise, etc.) then the sensitivity range of the detection circuit 140 can be extended into the femto-coulomb (fC) region. For example, in various embodiments, the maximum gain can be Av, max$\approx$274 dB, thus a charge input of Qin=100 fC would yield a voltage output Vout=0.5 V. The high sensitivity capabilities of the detection circuit 140 are evident in the low $\Delta Q$ values of the spectra, as shown in FIGS. 9 and 10.

The switches 12 and 13 of the switching circuit 3 and the reset switch 18 must be fast enough such that the fast thermal emptying transients of the DUT 1 can be sampled without signal degradation. At the same time, fast transients associated with the switches 12, 13 and 18 need to be minimized. Accordingly, in various implementations, the switches 12, 13 and 18 can be solid state analog switches based on CMOS technologies with sub-picoamp leakage current and low charge injection. Moreover the switches 12, 13 and 18 are controlled by counters/timers 8 and DAQ module 6, which are controlled by the control system 7, to switch between a parallel mode and a series mode, as described below. Alternatively, any other suitable solid state analog switching devices can be employed.

The low-noise secondary amplifier 4 provides additional gain to the signal output from the integration circuit 5. In various implementations, secondary amplifier 4 can comprise an op-amp with a built-in offset nulling capability. Accordingly, the secondary amplifier 4 can be utilized to zero-out the output during an integrator reset stage and null any jump caused by the switching charge injection.

The detection circuit 140 is structured and operable to operate in a parallel configuration for testing DUTs 1 comprising sensors and such, and also operate in a series configuration for testing DUTs comprising of a diode, e.g., a p-n diode or a Schottky diode. In the parallel mode configuration, the switch 12 closed, and the DUT 1 filling/excitation voltage $\Delta V_B$ is provided by the voltage divider 11. The parallel mode configuration is designed to probe the surface states of DUTs 1 comprising semiconductor-based sensors with symmetrical electrodes deposited on the sensing surface. However, if the DUT 1 is a p-n or a Schottky diode then the switch 12 is opened, thereby providing the series mode configuration of the detection circuit 140, whereby a reverse bias voltage is provided during the relaxation part of the measurement cycle. In series mode switch 12 is kept open and detection circuit 140 utilizes the DAQ module 6 to generate the analog excitation signal $\Delta V_B$. This analog excitation signal can be externally triggered by a reference signal/pulse (REF) (show in FIG. 2), and offset by the reverse bias or quiescent voltage $V_B$ during the relaxation part of the measurement cycle. The reference signal REF controls the timing of the initiation of each excitation signal $\Delta V_B$.

Alternatively, in various embodiments, it is envisioned that the excitation signal $\Delta V_B$ can be generated via and optical source, e.g., an LED that emit light within a specific light spectrum.

Figure 2:
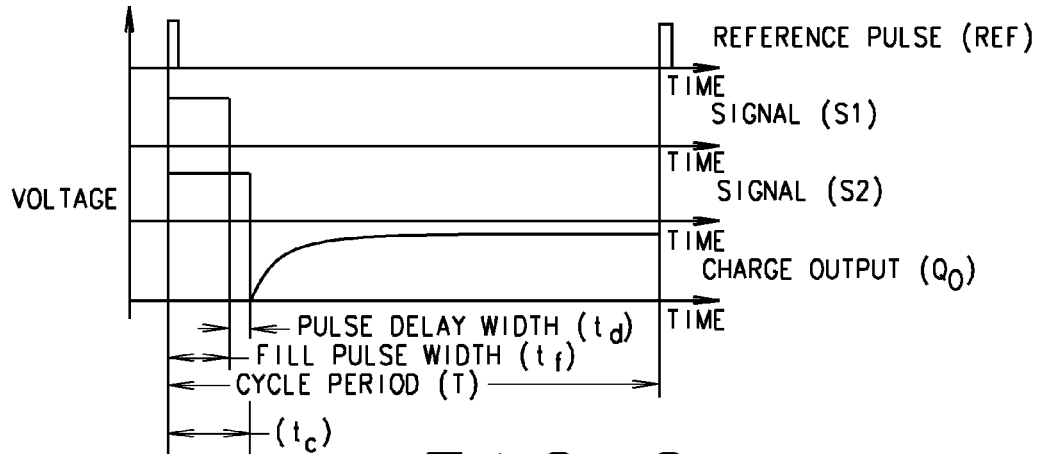
FIG. 2 is a timing waveform diagram showing three counter/timer signals and a characteristic exponential charge output during a single measuring cycle utilizing the Q-DLTS system shown in FIG. 1, in accordance with various embodiments of the present disclosure.
Figure 3:
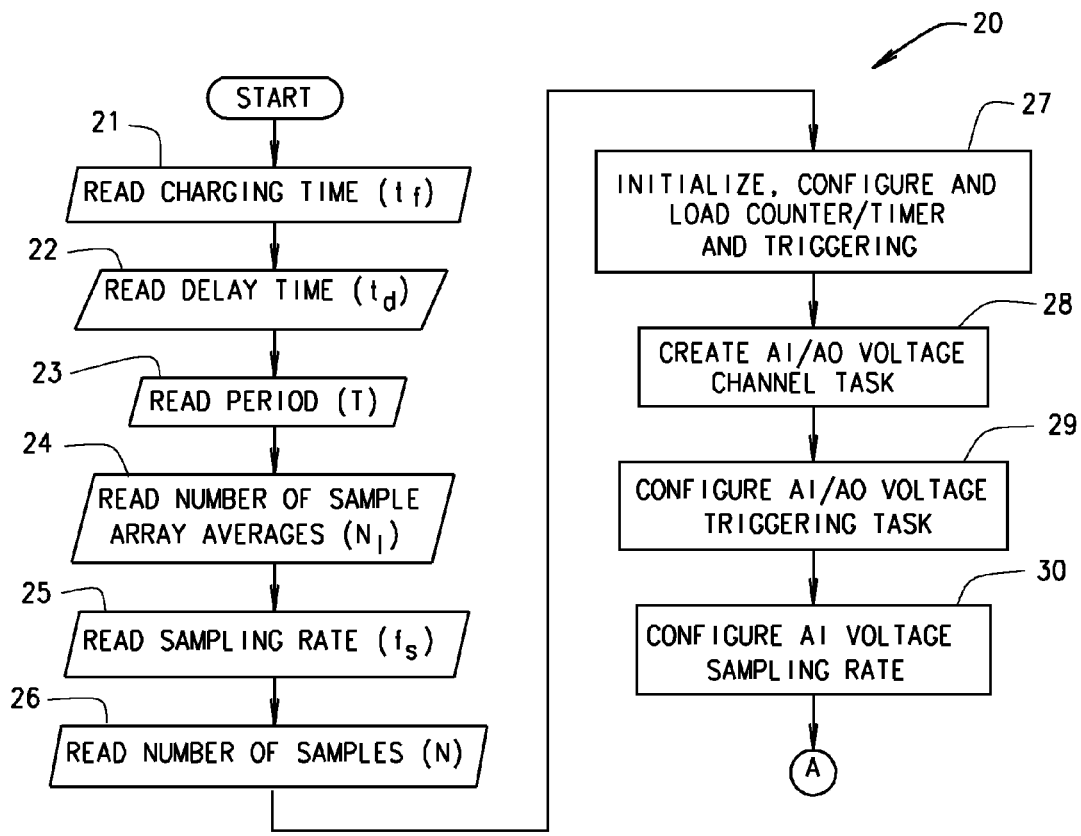
FIGS. 3 through 5 illustrate an exemplary flowchart of a sampling and timing algorithm executed by the Q-DLTS system shown in FIG. 1, in accordance with various embodiments of the present disclosure.
Figure 4:
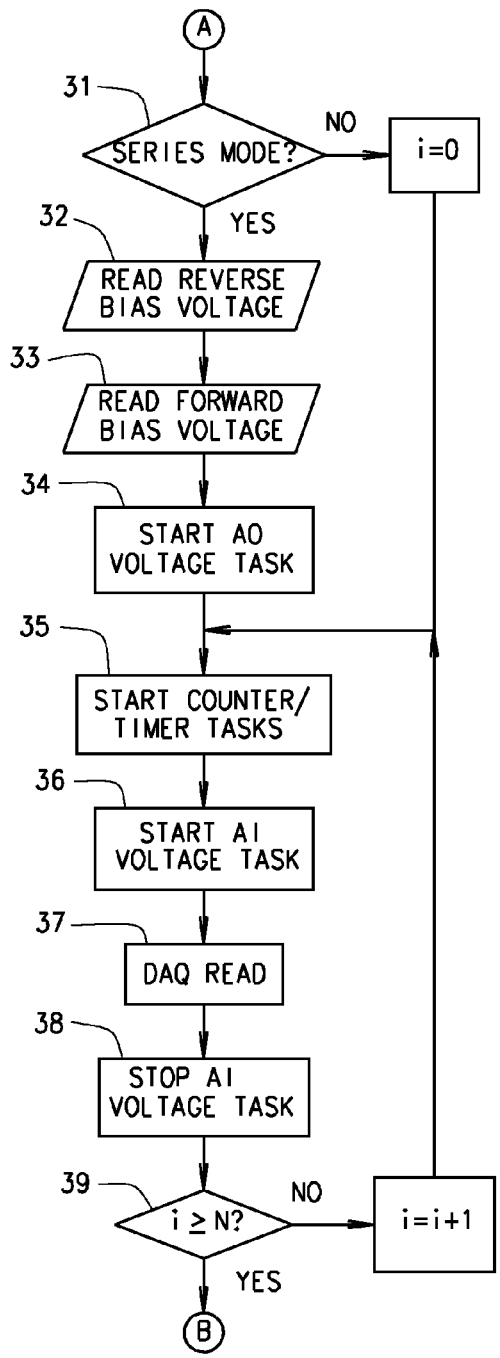
Figure 5:
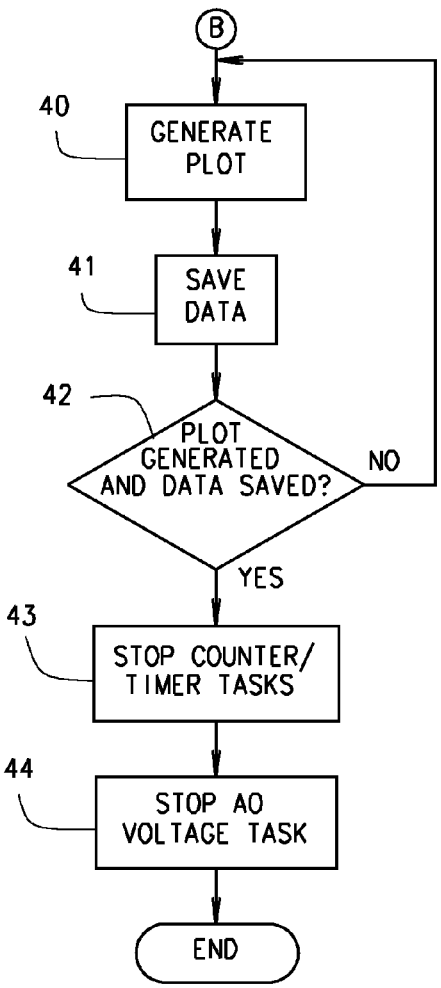
Figure 6:
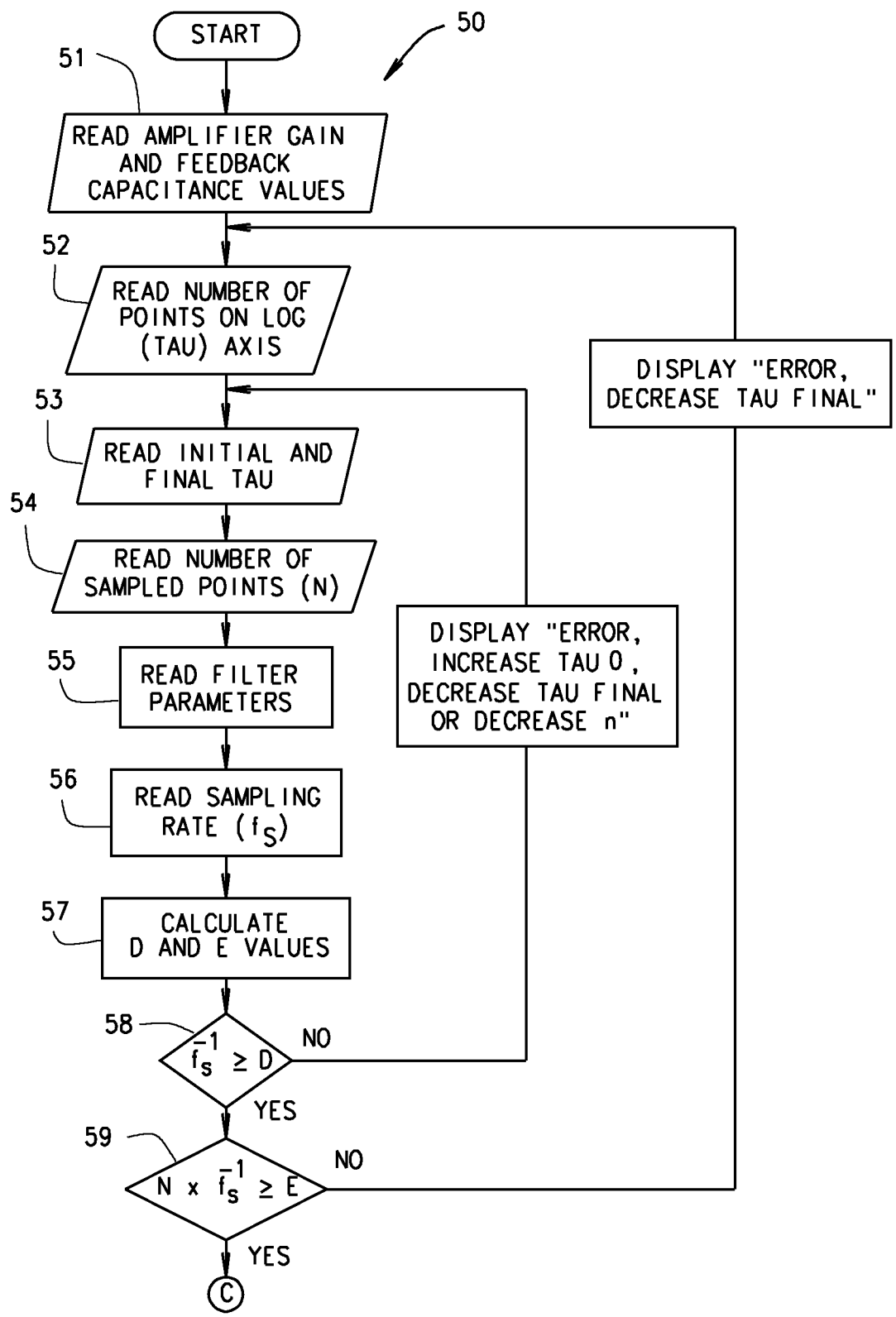
FIGS. 6 through 8 illustrate exemplary flowcharts of a data analysis program executed by the Q-DLTS system shown in FIG. 1, in accordance with various embodiments of the present disclosure.
Figure 7:
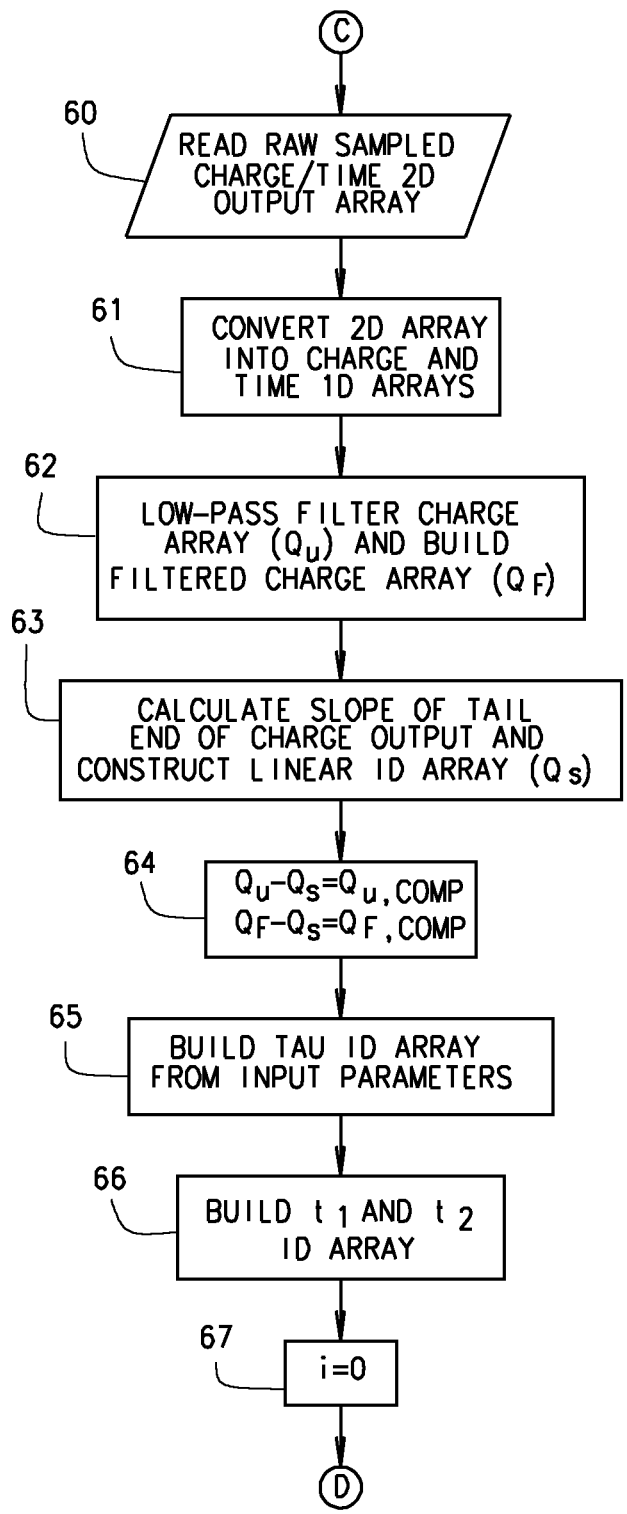
Figure 8:
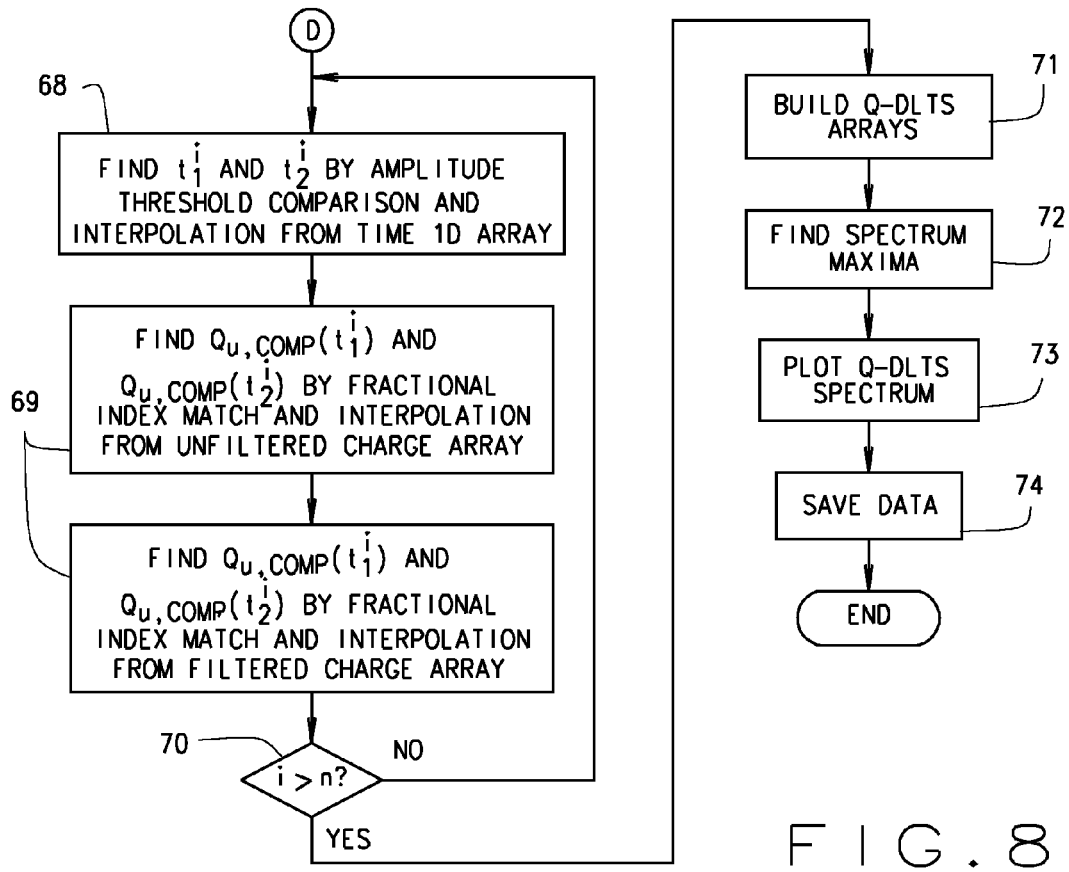

Referring now to FIG. 2, in FIG. 2 the top three waveforms REF, $S_1$, and $S_2$ are the voltage signals controlled by the DAQ module 6 that control the switching, i.e., timing, of switches 12 and 13, and $Q_0$ is the output of the amplifier circuit 142, i.e., the charge output of the DUT 1 converted to voltage by the integration circuit 5, referred to herein as the voltage charge output $Q_0$. Additionally, ($t_f$) is the width of the forward bias pulse, ($t_d$) is the signal delay width, and T is the period of a single measurement cycle. An analog bias pulse width ($t_c$) is configured to have the same length as the delayed switching signal (i.e., $t_c=t_f+t_d$). In various embodiments, two types of momentary filling or bias pulses $t_f$ are possible: 1) a saturating injection or forward bias pulse ($t_f$), which injects minority carriers into the depletion region of the DUT 1, and 2) a majority carrier or reverse bias pulse ($t_f$), which introduces majority carriers into the depletion region of the DUT 1.

In various embodiments, three counters/timers 8 are employed to produce the timing signals REF, $S_1$, and $S_2$. Signal 1 $S_1$ controls the operation and timing of switches 12 and 13. Signal 2 $S_2$ controls the operation and timing of the reset switch 18, which controls the timing of the operation of the integration circuit 5. As shown in FIG. 2, the initiation of signal 2 $S_2$, and hence the initiation of operation of the integration circuit 5, is slightly delay from the initiation of the excitation voltage $\Delta V_B$, and hence the output M of DUT 1. This delay compensates for, i.e., allows for the decay of, any voltage spikes or voltage transients produced by the signal switched 12 and/or 13.

Although FIG. 2 illustrates the counters/timers 8 as being separate from the DAQ module 6, in various embodiments, the DAQ module can include one or more of the counters/timers 8 that control the operation of the switches 12, 13 and 18. The reference signal REF controls the period of the excitation/discharge cycle of the DUT 1. The period T needs be long enough for all the long-lived trapped charge transients to decay away, which can be done by visually checking, e.g., utilizing an oscilloscope 15 or a recurrent voltage vs. time plot, for a flattening or plateauing of the total charge collected, and ensuring that the next cycle starts at some point in this region.

All the counters/timers 8 are dependent on a single configurable internal clock generator, thus, they cannot be used to output time events that are orders of magnitude different. For example, the reference signal REF period can be as long as a few seconds but the forward bias pulse width $t_f$ is often in the microsecond range. For this reason, another separate counter/timer chip 8 is required. As described above, in various implementations the DAQ module 6 can includes one or more independent counters that can be utilized for this purpose. The counter/timer chips 8 are used to generate the undelayed switching signal $S_1$ and the delayed switching signal $S_2$ using the reference pulse REF as a trigger source. The adjustable delay $t_d$ seen in the delayed signal $S_s$ is added to avoid the integration of the aforementioned switching transients. The delay value $t_d$ must be chosen carefully because the associated error $\phi$ is a function of the fastest charge transient present in the DUT 1 $\tau_T$. Experiments with several resistor/capacitor RC networks of various time constants yields the following error formula, $$\phi_d = 1 - \exp(-0.762 t_d \pi \tau_T^{-0.971}) \quad (12)$$

In various embodiments, a delay of 3.0 µs is effective to cancel out both the switching transients and parasitic coupling effects, while causing a delay error of less than 5.0% for traps emission rates of time constants slower than 50 µs.

Referring now to FIGS. 1, 2 and 3 through 5, the voltage charge output $Q_0$ produced at the output of the secondary amplifier 4 is an analog signal that is subsequently converted to digital values. The production and digitization of the voltage charge output $Q_0$ is accomplished via execution of an analog-to-digital (A/D) conversion and timing program 20 by the control system 7.

Generally, an Analog Input (AI) task is initiated by first creating an AI single-end channel in the DAQ module 6 to measure voltage. Next, a user-defined sampling rate of the voltage charge output $Q_0$ is configured via a sample clock that controls the timing and operation of the counters/timers 8. Then, the triggering for the AI task is configured using the delayed switching signal $S_2$ as the trigger source. The start, read, and stop parameters of the AI task are located inside a loop. Similar steps are performed for an analog output (AO) task. Each filling pulse $t_f$ is associated with a particular transient decay curve that is averaged after each cycle. The resulting data is stored in an array that is carried from one iteration to the next via shift registers. The signal-to-noise ratio SNR can be significantly improved by increasing the number of iterations ($N_i$). After the preset number of iterations is reached, the averaged data array is saved in an electronic storage device 102 of the control system 7 (shown in FIG. 12) and a plot is generated.

In various embodiments, the software communicates with the DAQ module 6 via a single Universal Serial Bus (USB) port such that the Q-DLTS system 130 will maintain its portability by allowing the use of a laptop PC as the control system 7. Additionally, to ensure high-speed bidirectional analog data transfer over USB, in various implementations the DAQ module 6 includes a 12-bit First In/First Out (FIFO) buffer that is utilized to transfer data to a data buffer in the control system electronic storage device 102, such that the data acquisition is hardware-timed and buffered. During the initial data request, the control system 7 sends a single high-level message that is interpreted and converted by the DAQ device 6 into the appropriate register-level commands to configure the timing of the counters/timers 8.

More specifically, as illustrated at 21, after execution of the conversion and timing program 20 is initiated, the program 20 reads the charging time ($t_f$) (a user-defined variable) during which the traps will be excited, that is, the time that the charge state of the deep centers will be under a non-equilibrium condition. Next, the delay time ($t_d$) (a user-defined variable) is read, as indicated at 22. The delay time ($t_d$) is the time during which integration of the charge by the integration circuit 5 will wait to avoid the integration of switching transients. Next, the read period (T) is read, as indicated at 23. The read period (T) is a user-defined variable time that it will take for a single cycle to perform the required deep level(s) excitation and discharge. As indicated at 24, the program 20 next reads the number of sample array averages ($N_i$). The number of sample array averages ($N_i$) (a user-defined variable) is the number of iterations or cycles that the sample amplitude array parameter is averaged to increase the signal-to-noise ratio (SNR). Next, the sampling rate ($f_s$) is read, as indicated at 25. The sampling rate ($f_s$) (a user-defined variable) is the number of samples per unit time taken from the voltage charge output signal $Q_o$ which are used to populate each amplitude and time array.

Next, the number of samples points (N) is read, as indicated at 26. The number of samples points (N) (a user-defined variable) is the array size of the sampled raw data. As indicated at 27, the program 20 next sends instructions to initialize and configure the counters/timers 8 and load the associated registers, e.g., 16-bit registers, and configure level gating based on user-defined parameters. Next, the program 20 sends instructions to the data acquisition (DAQ) device 6 to create an analog Input (e.g., DUT 1 amplified charge output) and analog output channels (e.g., excitation voltage in diode/serial mode) based on user-defined parameters, as indicated at 28. Next, the program 20 sends instructions to the analog input (AI) channel of the DAQ device 6 to trigger on the lowering edge of the delayed switching signal $S_2$, as indicated at 29. Next, instructions are sent to the AI channel of the DAQ device 6 to sample according to the corresponding user-defined parameter, as indicated at 30.

As indicated at 31, the program 20 next requests user input as to whether the DUT 1 is a p-n or Schottky diode. If true, the detection circuit 140 is configured in series mode and the DAQ device 6 is instructed to read the quiescent reverse bias voltage ($V_B$) from the corresponding AI during the relaxation part of the measurement cycle, as indicated at 32. As described above, in series mode the signal switch 12 is kept open, and the filling pulse (injection or majority carrier) is generated from one of the DAQ device 6 analog outputs. The DAQ analog output waveform must be externally triggered by the reference signal REF, and offset by $V_B$ during the relaxation part of the measurement cycle. The analog bias pulse width ($t_c$) is then configured to have the same length as the delayed switching signal (i.e., $t_c=t_f+t_d$). Next, the program 20 sends an instruction to the DAQ device 6 to read the injection pulse amplitude from the corresponding AI channel, as indicated at 33. Next, the program 20 instructs DAQ device 6 to start an AO voltage task from the corresponding AO channel, according to triggering and amplitude parameters defined by user, as indicated at 34.

Referring again to the decision box indicated at 31, if false, the detection circuit 140 is configured in parallel mode, the signal switch 12 is closed and the DUT filling voltage ($\Delta V_B$) is provided by the voltage divider 11. The parallel mode configuration is designed to probe the surface states of semiconductor-based sensors with symmetrical electrodes deposited on the sensing surface.

Subsequently, (regardless of whether he detection circuit 140 is series or parallel mode) the program 20 sends instruction to at least one of the counters/timers 8 to begin counting operations based on user-defined parameters, as indicated at 35. Next, a command is sent to DAQ module 6 to begin analog sampling based on user-defined parameters, as indicated at 36.

Then an instruction is sent to the DAQ module 6 to read data stored in built-in memory buffers of the DAQ module 6, as indicated at 37. Next, a command is sent to the DAQ module 6 to stop analog sampling based on user-defined parameters, as indicated at 38. As indicated at 39, if the number of samples N is met by the loop increment then the program 20 will continue to step 40, if not, then number of samples N is averaged and the program 20 loops back to step 35.

If the number of samples N is met, then the program 20 will generate a plot of averaged amplitude data array and the data is stored in the electronic storage device 102 of the control system 7, as indicated at 40 and 41. Next, as indicated at 42, if the plot is generated and the data is saved, the program 20 proceeds to step 42, but if not, then the program 20 loops back up to step 40. In various embodiments, if the plot is not generated and the data saved after a predetermined time for, an error message is displayed on a display of the control system 7 and the loop is exited. If the plot is generated and the data saved, the program 20 sends an instruction to the respective counters/timers 8 to stop the counting operations based on user-defined parameters, as indicated at 43. Subsequently, the program 20 instructs the DAQ device 6 to stop AO the voltage task from the appropriate AO channel, as indicated at 44, and the program 20 is ended.

Referring now to FIGS. 1, 2 and 6 through 8, after execution of the conversion and timing program 20, the control system begins execution of a Q-DLTS data analysis program 50 to fetch all the data points generated via execution of conversion and timing program 20 and use the fetched data points to produce a spectrum such as those illustrated in FIGS. 10 and 11. Generally, the Q-DLTS data analysis program 50 calculates points on the abscissa or τ-axis, which has units of log(μs). The parameter input sequence is inside a loop structure to ensure that the sample rate constraints are met. If this is not achieved, the program 50 prompts the user to reenter all or some of these values.

The sampling rate of the de-excitation transient must be fast enough so even the fastest thermal emissions can be processed by the Q-DLTS algorithm 50. This can only be accomplished if the sampling rate ($f_s$), and the rate window initial ($\tau_o$) and final ($\tau_f$) values obey two constraint equations, as indicated at 56 and 54. The first equation, indicated at 58, is $$ff_s^{-1} \geq ln\, \alpha((10^{\wedge}(\log(\tau_0)+l))-(10^{\wedge}(\log(\tau(\tau_0)))) \qquad (13)$$

where l is the logarithmic rate window interval defined by $$l = \frac{\log(\tau_0) - \log(\tau_f)}{n} \qquad (14)$$

and n is the desired number of points on the abscissa of the Q-DLTS spectrum. It is easy to verify that the subtraction terms in Eq. 13 correspond to $\tau_1$ and $\tau_o$, respectively. Because the software is dealing with discrete values, the inverse of the sampling rate cannot be lesser than the difference of the first two user selected values of $t_1$.

For simplicity, the right side of Eq. 13 is called D. The second constraint equation, as indicated at 59, is $$f_s^{-1} \geq \frac{\alpha \ln(\alpha) \tau_f}{N} \qquad (15)$$

where N is the total number of sampled points read at step 54. The numerator of Eq. 15 corresponds to the largest value of $t_2$, thus the equation forces this value not to exceed the last sampled data point. Since extrapolation is unfeasible in these ranges, the highest rate window and its associated $t_2$ value are the main reason for unused data. For simplicity, the right side of Eq. 15 is called E. In the present embodiment, the maximum sampling rate fs,max=250 kHz, therefore, the values of $\tau_o$, $\tau_f$ and n must be chosen accordingly.

The amplitude or charge output array is first smoothed by the mean displaced ratio (MDR) method and then digitally filtered via a Butterworth low-pass filter, as indicated at 62. This filter was chosen due to its small frequency response characteristics, however, other types of filters are possible. Knowing l, n and $\tau_o$ allows the program 50 to calculate each pair of $t_1$ and $t_2$ values by linear interpolation from the time array, as indicated at 68. The corresponding charge values are then linearly interpolated from the amplitude array, as indicated at 69, which was previously converted to units of charge (pC). Finally, the spectrum is plotted and the data is stored in the electronic storage device 102 of the control system 7. The Q-DLTS peaks are calculated by grouping sequential data points in arrays of equal user-defined length. Each group of data points are fit into quadratic polynomials and then differentiated twice to obtain each peak's amplitude, location and sharpness.

A typical Q-DLTS uncompensated spectrum will show the presence of several non-ideal spectral features. Most notably, the junction's temperature-dependent leakage current under reverse bias is unavoidably integrated alongside the charge output of the DUT, and appears as an exponentially increasing charge at the tail end of the spectrum. This behavior can be partially hardware-compensated with a small and opposite (to the leakage) current produced the bias compensation module 9. In addition, two software leakage suppression methods are possible. If the leakage is integrated and digitized from the diode under reverse bias, then this data set can then be subtracted to the total charge output. An alternative algorithm is to calculate the slope of the curve of the leakage vs time after all transients attributed to carrier emission have decayed away, as indicated at 63. Since the leakage is constant, the slope is then used to artificially create an integrated leakage current array that is subtracted from the total charge output array, as indicated at 64.

Another non-ideal spectral feature accentuated at low trap concentrations are peaks associated with coupled parasitic capacitance (i.e., from coaxial cabling, circuitry, etc.) and charge injection. These usually appear as fast time-independent narrow peaks. For a given peak, the Q-DLTS spectrum yields information of both the total charge output (Eq. 11) and the transient time constant (Eq. 9). These parameters can be used to artificially generate the corresponding charge data array and subtract it from the total DUT charge output. Another option is to use the delay time feature following Eq.12, however, this option is only valid for capacitive coupling whenever its time constant is faster than the fastest trap emission time constant.

More specifically, as illustrated at 51, after execution of the Q-DLTS data analysis program 20 is initiated, the program 50 reads the values (user-defined variables) related to charge collection in the previous sampling stage, as indicated at 51. These values are hardware parameters that must be input as constants in the Q-DLTS algorithm 50. Next, the user-defines values for the number of desired points (n) on the Q-DLTS spectrum abscissa, as indicated at 52. Next, the program 50 reads the values (user-defined variables) for the initial and final values of the rate window array ($\tau_o$ and $\tau_f$ respectively), as indicated at 53. After $\tau_o$ and $\tau_f$ are read, the program 50 determines the value of sampled points in the raw charge output array ($Q_U$) obtained during the sampling stage, as indicated at 54.

Next, the amplitude or charge output array is smoothed by the mean displaced ratio (MDR) method and then it is digitally filtered via a Butterworth low-pass filter, as indicated at 55. Next, the program 50 determines the sampling rate ($f_s$) (must be a constant value) at which the data of the raw charge output array ($Q_U$) was obtained, as indicated at 56. Next, as indicated at 57, the utilizes the following equations to determine the values of D and E, $$D = ln\alpha((10^{\wedge}(log(\tau_o)+l))-(10^{\wedge}(log(\tau_o))))$$

and $$E = \alpha ln(\alpha)\tau_f$$

As indicated at 58, the program 50 next determines whether the value of the inverse of the sampling rate is higher or equal than D. If true, the program 50 proceeds to step 59 continue. If false, a warning is display by the control system 7 to prompt for a change of input parameters and go to step 53, e.g. "ERROR, increase TAU 0, decrease TAU final or decrease n". As indicated at 59, the program 50 then determines if the multiplication of the number of sampled points times the inverse of the sample rate is higher or equal than E. If true, the program 50 proceeds to step 60. If false, a warning is displayed by the control system 7 to prompt for a change of input parameters and go to step 52, e.g, "ERROR, decrease TAU final". Next, a 2-dimensional output array is obtained from the sample stage containing both charge output ($Q_u$) and associated time values, as indicated at 60. This command will fetch these values from the array stored in the memory storage device 102 of the control system 7. Next, the program 50 converts the 2-dimensional array into a charge and time 1-dimensional array by separating the 2-dimensional charge and time array in two independent 1-dimensional arrays of the same size (i.e., number of elements), as indicated at 61.

Next, the program 50 builds filtered charge array ($Q_F$) by applying and low-pass filter to the charge array ($Q_U$) (e.g., a low-pass Butterworth, or similar, filtering algorithm based on user-defined parameters), thereby fetching the value of unfiltered charge arrays, as indicated at 62. Next, the program 50 calculates the slope of the tail end of charge output and constructs a linear 1-dimensional array ($Q_S$), as indicated at 63. That is the 1-dimensional arrays $Q_U$ and $Q_F$ contain a large amount of unusable data that visually it is shaped like the plateau of a logarithmic curve (not applicable for non-exponential transients behavior such as spatially in-homogeneous emission rates) that should have a zero slope, but usually has non-zero slope caused by leakage currents and non-ideal circuit behavior.

The non-zero slope can be used to cancel-out this behavior by applying. For example, as indicated at 64, offset algorithms $Q_U - Q_S = Q_{U,COMP}$ and $Q_F - Q_S = Q_{F,COMP}$ can be applied to offset the non-zero slope of the logarithmic-shaped curve of the charge output array. Next, the program 50 builds 1-dimensional array of the rate window or TAU values based on user-defined parameters, as indicated at 65. Next, as indicated at 66, the program 50 builds 1-dimensional time arrays $t_1$ and $t_2$ wherein each value of the rate window or TAU array depends on two time values based on the equation, $$\tau^{-1} = \frac{\ln(t_2/t_1)}{t_2 - t_1} = \frac{\ln\alpha}{(\alpha - 1)t_1}.$$

Next, a loop counter variable I is created and set to a value of zero and a while loop is started, as indicated at 67. Next, the program 50 finds time values $t^i_1$ and $t^i_2$, as indicated at 68. More specifically, the values of the elements of the $t_1$ and $t_2$ arrays may or may not match the discretized values of the 1-dimensional time array obtained from the sampling stage. Therefore the 1-dimensional time array is scanned twice (i.e., for each $t^i_1$ and $t^i_2$ value) and after the threshold values are found, the location (i.e., indexes) of where each $t^i_1$ and $t^i_2$ value should be located in the 1-dimensional time array is found by linear interpolation. Next, as indicated at 69, the values of $Q_{U,COMP}(t^i_1)$ and $Q_{U,COMP}(t^i_2)$ are calculated by fractional index match and interpolation from unfiltered charge array. Particularly, the corresponding $Q_{U,COMP}(t^i_1)$ and $Q_{U,COMP}(t^i_2)$ from the $Q_U$ array are found by index matching and linear interpolation and two new arrays are constructed.

Next, as indicated at 70, the program 50 determines if he loop counter (i) is higher or equal than number of desired points (n) on the Q-DLTS spectrum abscissa. If false, the program 50 returns to step 68, if true, the program 50 continues to step 71. Next, as indicated at 71, the program 50 builds 2-dimensional Q-DLTS arrays (from the unfiltered and filtered Q arrays and the TAU array based on the equation, $$\Delta Q = Q(t_1) - Q(t_2),$$

Wherein, the TAU array is the same for both Q-DLTS arrays. Next, the maxima of the Q-DLTS spectrum in terms of amplitude (i.e, $\Delta Q$) are calculated by grouping sequential data points in arrays of equal user-defined lengths, as indicated at 72. Each group of data points are fit into quadratic polynomials and then differentiated twice to obtain each peak's amplitude, location and sharpness. Next, the program 50 plots the Q-DLTS spectrum from the unfiltered and filtered 2-dimensional Q-DLTS arrays, as indicated at 73, and the 2-dimensional Q-DLTS arrays are stored in the electronic memory device 102 of the control system 7, as indicated 74.

Referring now to FIGS. 9, 10 and 11, an experimental study was done on the acceptor levels present in commercial low brightness GaN/SiC blue LED structures (e.g., a Kingbright type KP-1608MBC blue LED). Group-III nitrides LEDs have been extensively studied in the past in terms of failure modes, degradation and aging mechanisms. The photoluminescence in the blue spectral range is obtained by the incorporation of Mg acceptor impurities, which results in p-type doping. Nitrogen vacancies ($V_N$) are also formed during the GaN growth with similar concentrations of that of the Mg acceptor. The LED structures were of the form of square dices (0.0136× 0.0136 mm$^2$) mounted p-side up on ceramic stems and encapsulated in epoxy resin.

For the present study employing the Q-DLTS system 130 and programs 20 and 50 described above, four LED junctions were placed in parallel to increase the deep centers charge output. Q-DLTS measurements were carried out using the following parameter settings: $\Delta V_B$=3.5 V, $V_B$=−1.0 V, $t_c$=20 ms, $t_d$=0 µs, T=200 ms, $N_f$=100, $A_v$=226 dB, and $f_s$=250 kHz. This particular saturating injection pulse voltage, which matches the GaN bandgap, was chosen to reveal the minority-carrier traps (i.e., donor levels) present in the structure. The temperature range is from 256-296 K measured in increments of ~7 K.

The characteristic I-V curve of the unstressed sample at room temperature (FIG. 9) confirms the presence of a p-n junction. FIG. 10 shows the uncompensated Q-DLTS spectrum of the as-received LED device. The graph shows the presence of a typical isothermal capacitance peak at $\tau \approx 50$ µs, however, its small amplitude does not interfere with the measurement of the main peak under test. Leakage effects, on the other hand, are significant, and must be compensated for the peak-finding algorithm to function properly. FIG. 11 shows the compensated spectrum.

The filling pulse is long enough to assure that a quasisteady state and full trap charge saturation are reached. This procedure is performed during the setup stage and at low temperatures by increasing $t_c$ until no further long-lived peaks appear in the spectrum. In samples with strong leakage currents, however, any long-lived peaks will be buried by the integration process regardless of the correction algorithm employed. As expected, the position of the visible single dominant peak shifts to shorter time constants as the temperature is increased. From the Q-DLTS spectra, an Arrhenius plots was used (inset of FIG. 11) to calculate the values of the trap apparent activation energy $E_a$=0.381 eV, and capture cross-section $\sigma$=1.69E−17 cm$^2$. These values closely match those found in the literature for similar LED structures. In particular, a state of similar activation energy has previously been associated to a deep Mg—$V_N$ donor center. This complex is formed when a Mg acceptor associates with an oppositely charged nearest-neighbor nitrogen vacancy at high Mg doping levels. This complex, together with a Mg shallow acceptor, participate in a donor-acceptor pair (DAP) transition that has been shown to be responsible for the well-documented 2.8 eV blue photoluminescence band at room temperature.

Figure 12:
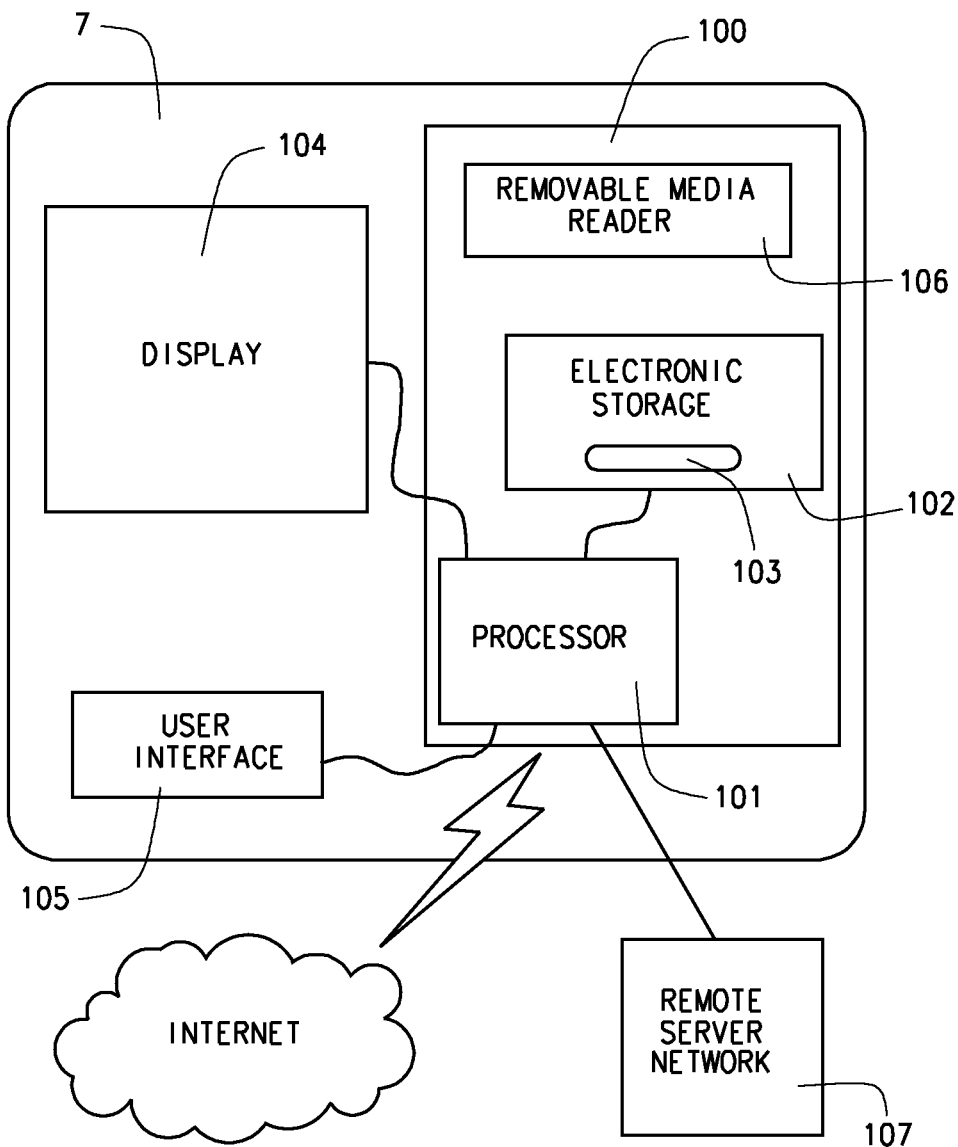
FIG. 12 is a block diagram of a computer based control system of the Q-DLTS system shown in FIG. 1, in accordance with various embodiments of the present disclosure.

Referring now to FIG. 12, as described above, the Q-DLTS system 130, particularly, the detection circuit 140, is controlled by the computer based control system 7, more particularly, by execution of the various algorithms, software and programs described above by a processor of the control system 7. The control system 7 comprises one or more computers 100. Generally, each computer 100 includes at least one processor 101 suitable to execute the various algorithms, software and programs described above to control all functions of 7 control system 7 and, hence, the operation of the Q-DLTS system 130, as described herein. Each computer 100 additionally includes at least one electronic storage device 102 that comprises a computer readable medium, such as a hard drive or any other electronic data storage device for storing such things as the signal sampling, timing and analysis algorithm(s), the analog-to-digital (A/D) conversion and timing program 20 and the Q-DLTS data analysis program 50, described above, and various other algorithms, programs, software, digital information, data, look-up tables, spreadsheets and databases, illustrated as 103 in FIG. 12. Furthermore, the control system 7 includes a display 104 for displaying such things as information, data and/or graphical representations, and at least one user interface device 105, such as a keyboard, mouse, stylus, and/or an interactive touch-screen on the display 104. In various embodiments each computer 100 can include a removable media reader 106 for reading information and data from and/or writing information and data to removable electronic storage media such as floppy disks, compact disks, DVD disks, zip disks, flash drives or any other computer readable removable and portable electronic storage media. In various embodiments the removable media reader 106 can be an I/O port of the respective computer 100 utilized to read external or peripheral memory devices such as flash drives or external hard drives.

In various embodiments, the control system 7, e.g., one or more of the computers 100, can be communicatively connectable to a remote server network 107, e.g., a local area network (LAN), via a wired or wireless link. Accordingly, the control system 7 can communicate with the remote server network 107 to upload and/or download data, information, algorithms, software programs, and/or receive operational commands. Additionally, in various embodiments, the control system 478 can be structured and operable to access the Internet to upload and/or download data, information, algorithms, software programs, etc., to and from Internet sites and network servers.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A method for detecting surface and bulk deep states in semiconductor materials, said method comprising:
setting a switch of a switching device of a detection circuit of charge based deep level transient spectrometer to one of a closed position to configure the detection circuit in a parallel mode, wherein the the detection circuit is configured to test a first type of semiconductor material, and an open position to configure the detection circuit in a series mode, wherein the the detection circuit is configured to test a first type of semiconductor material,
inputting, via a user interface of the detection circuit user defined inputs, the user defined inputs comprising:
a charging time during which traps of a device under test will be excited;
a delay time during which integration of charge outputs from the device under test will wait to avoid the integration of switching transients;
a read period for defining a duration of a single cycle for the excitation of the traps and a discharge of the charge output of the device under test;

a number of sample array averages defining a number of iterations that a sample amplitude array parameter is averaged to increase the signal-to-noise ratio;

a sampling rate defining a number of samples per unit time taken from a voltage charge output signal which are used to populate an amplitude and time array; and a number of samples points defining a size of the amplitude and time array;

inputting to the device under test, via a data acquition module of the detection circuit, excitation voltage pulses based on the input user defined inputs and the switch setting, and via execution of an analog-to-digital conversion and timing program by a control system of the charge based deep level transient spectrometer;

sampling, via the data acquistion module, digitized voltage charge outputs of the device under test generated in response to the input excitation voltage pulses, based on the user inputs and via execution of the analog-to-digital conversion and timing program by the control system; and obtaining at least one of a trap density, a trap emission rate, and a trap activation energy for deep level transients of the device under test based on the digitized voltage charge outputs via execution of a Q-DLTS data analysis program by the control system.

2. The method of claim 1, wherein sampling the digitized voltage charge outputs of the device under test utilizing the detection circuit as controlled via execution of an analog-to-digital conversion and timing program further comprises converting the charge outputs of the device under test to the voltage charge outputs and amplifying the voltage charge outputs based on the user inputs utilizing an integration circuit of the detection circuit controlled by the data acquisition module via execution of the analog-to-digital conversion and timing program.

3. The method of claim 2, wherein sampling the digitized voltage charge outputs of the device under test utilizing the detection circuit as controlled via execution of an analog-to-digital conversion and timing program further comprises further amplifying the amplified voltage charge outputs from the integration circuit based on the user inputs utilizing a secondary amplifier of the detection circuit as controlled by the data acquisition module via execution of the analog-to-digital conversion and timing program.

4. The method of claim 3 wherein sampling the digitized voltage charge outputs of the device under test utilizing the detection circuit as controlled via execution of an analog-to-digital conversion and timing program further comprises further comprises converting the voltage charge outputs to digital signals based on the user inputs via execution of an analog-to-digital conversion and timing program by the control system.

5. The method of claim 4, further comprising generating the amplitude and time array utilzing the digitized voltage charge output signals based on the user inputs via execution of an analog-to-digital conversion and timing program by the control system.

6. The method of claim 5 wherein obtaining at least one of a trap density, a trap emission rate, and a trap activation energy for the deep level transients of the device under test based on the digitized voltage charge outputs comprises fetching data from the amplitude and time array and computing the at least one of a trap density, a trap emission rate, and a trap activation energy for deep level transients via execution of a control system operable to execute a Q-DLTS data analysis program by the control system.

7. A device for detecting surface and bulk deep states in semiconductor materials, said device comprising:

a control system comprising:

an electronic storage device structured and operable to store an analog-to-digital conversion and timing program and a Q-DLTS data analysis program;

a processor structured and operable to execute the analog-to-digital conversion and the timing program and a Q-DLTS data analysis program; and a user interface structured and operable to receive user defined inputs, the user defined inputs comprising:

a charging time during which traps of a device under test will be excited;

a delay time during which integration of charge outputs from the device under test will wait to avoid the integration of switching transients;

a read period for defining a duration of a single cycle for the excitation of the traps and a discharge of the charge output of the device under test:

a number of sample array averages defining a number of iterations that a sample amplitude array parameter is averaged to increase the signal-to-noise ratio;

a sampling rate defining a number of samples per unit time taken from a voltage charge output signal which are used to populate an amplitude and time array; and a number of samples points defining a size of the amplitude and time array; and a detection circuit structured and operable to input voltage pulses to a device under test based on the input user defined inputs and via execution of an analog-to-digital conversion and timing program by the control system, and sample digitized charge outputs of the device under test resulting from the voltage pulses, based on the user inputs and via execution of the analog-to-digital conversion and timing program by the control system, the detection circuit comprising:

a switching circuit structured and operable to configure the detection circuit in one of a parallel mode and a series mode;

an integration circuit structured and operable to convert the charge outputs of the device under test to the digitized voltage charge outputs and amplify the digitized voltage charge outputs;

a secondary amplifier structured and operable to further amplify the amplified digitized voltage charge outputs from the integration circuit;

a data acquisition module operable to control the provision and timing of the voltage pulses to the device under test, the operation of the switching circuit, and the operation of the integration circuit, wherein the control system is further structured and operable to execute the Q-DLTS data analysis program to obtain at least one of a trap density, a trap emission rate, and a trap activation energy for the deep level transients of the device under test based on the digitized voltage charge outputs.

8. The device of claim 7, wherein the detection circuit is configured in the parallel mode when the device under test comprises a semiconductor device.

9. The device of claim 7, wherein the detection circuit is configured in the serial mode when the device under test comprises a sensor.

* * * * *